United States Patent [19]

Sengupta

[11] Patent Number: 5,007,478

[45] Date of Patent: Apr. 16, 1991

[54] MICROENCAPSULATED PHASE CHANGE MATERIAL SLURRY HEAT SINKS

[75] Inventor: Subrata Sengupta, Coral Gables, Fla.

[73] Assignee: University of Miami, Coral Gables, Fla.

[21] Appl. No.: 357,719

[22] Filed: May 26, 1989

[51] Int. Cl.⁵ .................. F28D 20/00; H01L 23/44; H01L 23/473

[52] U.S. Cl. ...................... 165/10; 165/104.33; 165/104.11; 165/104.19; 165/902; 361/385

[58] Field of Search ............ 165/47, 10, 902, 104.33, 165/104.11, 104.19; 361/385

[56] References Cited

U.S. PATENT DOCUMENTS 4,463,799  8/1964  Takahashi et al. ............. 165/10
4,807,696  2/1989  Colvin et al. .................. 165/10

FOREIGN PATENT DOCUMENTS 27890  3/1981  Japan ...................... 165/104.17

OTHER PUBLICATIONS

Reprint Electronic Products Magazine—Product of the Year Awards, 1/1989 (3M).

Primary Examiner—Albert W. Davis, Jr.
Attorney, Agent, or Firm—Cushman, Darby & Cushman

[57] ABSTRACT

A slurry of micro-encapsulated phase change materials is provided in accordance with the present invention as a heat sink for, for example, the thermal management of electronic components. The slurry of micro-encapsulated phase change material may be provided within an open container and the electronic component immersed therein. In the alternative, the slurry of micro-encapsulated phase change material can be provided within a container of either flexible bag-like design or a relatively rigid preformed structure to be mounted adjacent the article to be thermally controlled.

20 Claims, 2 Drawing Sheets

Microencapsulated Phase Change Material

Microencapsulated Phase Change Material

MICROENCAPSULATED PHASE CHANGE MATERIAL SLURRY HEAT SINKS

BACKGROUND OF THE INVENTION

1. Field of the Invention

The present invention relates to the thermal management of electronic devices and, in particular, to the use of phase change material as a heat sink for an electronic component.

2. Description of the Related Art

Heat transfer in electronic systems has become a critical design parameter as module level heat transfer has increased exponentially making current cooling technologies inadequate. Indeed, thermal management of electronic devices has become an extremely important field as miniaturization technology has advanced, creating very high heat fluxes at the module level. Further, the performance and reliability of electronic devices are dependent on the maintenance of suitable operating temperatures and a minimization of temperature variations. Therefore, heat generated in a module during normal operation must be continuously removed in order to maintain individual electronic components at approximately constant temperatures for optimum operation. Peak loads which can cause a sudden temperature rise also occur from time to time and it is critical that the cooling system be capable of handling such transient loads.

Commonly used heat removal systems include conductive heat sinks, cold plates, direct impingement cooling systems and heat pipes. However, most methods of electronics cooling are fast approaching their limits in view of the recent advances in large scale integration.

Passive temperature control units using phase change materials have been used in the past. The heat generated in the electronic package is absorbed primarily by the melting of the phase change material with some additional sensible heat absorption by the liquid phase of the phase change material.

Honeywell Corporation uses a heat transfer fluid in a plastic bag as a heat removal and temperature control unit. An example of a suitable heat transfer fluid in that structure is 3M fluorinert (FC77). In the case of this device, however, natural convection heat transfer is limited by the properties of the heat transfer fluid.

Active temperature control units are also commonly used. For example, high power electronic components or high density electronic assemblies are often cooled using cold plates 16 brazed to the bottom of the chip assemblies 18 (see FIG. 1). Heat transferred to the cold plates by conduction is removed by forced convection to air which flows through at 20, or for higher heat fluxes, to a liquid coolant such as water.

SUMMARY OF THE INVENTION

It is an object of the present invention to overcome the limitations and deficiencies of the passive and active heat transfer systems noted above.

Previous research has shown that solid-liquid suspensions have superior heat transfer characteristics as compared to simple fluids. This is due to a combination of several factors. The first factor is a difference in the thermophysical properties of a mixture as compared to that of a suspended liquid. The overall heat transfer is determined by the actual properties of the suspension itself. For forced convection flows, the relevant properties are thermal conductivity, specific heat and viscosity. For natural convection, the coefficient of thermal expansion must also be considered. For suspensions which are not neutrally buoyant, the density also affects the heat transfer.

In addition to the actual property changes, the microconvective effects due to the presence of particles themselves enhances heat transfer. For turbulent flows, the particles also disrupt the laminar sublayer, thus increasing heat transfer.

Finally, in addition to the increase in effective specific heat because of the latent heat of melting, the use of a phase change material also helps sustain a large temperature difference with the suspension temperature remaining approximately constant until the phase change material has completely melted. This further enhances heat transfer.

It is therefore an object of the present invention to provide microcapsules of phase change material in suspensions and to thereby provide improved passive temperature control units having superior heat transfer characteristics. Suspensions of phase change materials provided in accordance with the present invention may also be utilized as active heat removal systems, for example, employing a suspension of phase change material in accordance with the present invention in existing hardware for active heat removal systems.

Other object, features and characteristics of the present, as well as the methods of operation and functions of the related elements of the structure, and the combination of parts and economies, will become more apparent upon consideration of the following description and the appended claims with reference to the accompanying drawings, all of which form a part of the specification, wherein like reference numerals designate corresponding parts in the various figures.

DETAILED DESCRIPTION OF THE PRESENTLY PREFERRED EXEMPLARY EMBODIMENT

In order to overcome the problems associated with currently available passive temperature control units, a modified thermal control unit has been developed. The device defines a chamber which is filled with a suspension of microencapsulated phase change material. The use of such a suspension has a number of advantages. For example, the melt-phase cycle will be more effectively utilized by using a suspension. Indeed, because of natural convection in the suspension, particles will continuously circulate in the chamber. In addition, as noted above, previous studies have shown that the heat transferred to a solid-liquid suspension is significantly higher than that to a single fluid. For example, for a concentrated agitated non-phase change suspension, increases of about 50% in heat transfer coefficient have been reported. Further, in a study of natural convection heat transfer using a dilute phase change slurry, a twofold increase in heat transfer was found. Thus, heat transfer from the wall will be greater when a suspension of phase change material is used and transient temperature rises will be minimized. For the case of localized power surges, the use of a suspension will be particularly advantageous as natural convection will ensure the participation of microcapsules throughout the fluid. As a result, the effective heat capacity of the heat sink will be even greater.

Figure 1:
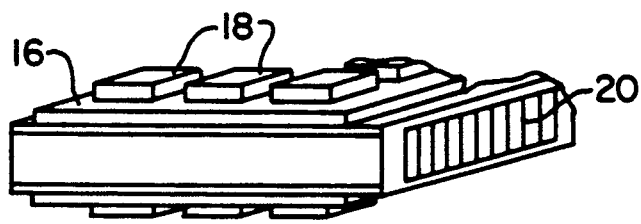
FIG. 1 is a schematic view of a conventional active temperature control unit.
Figure 2:
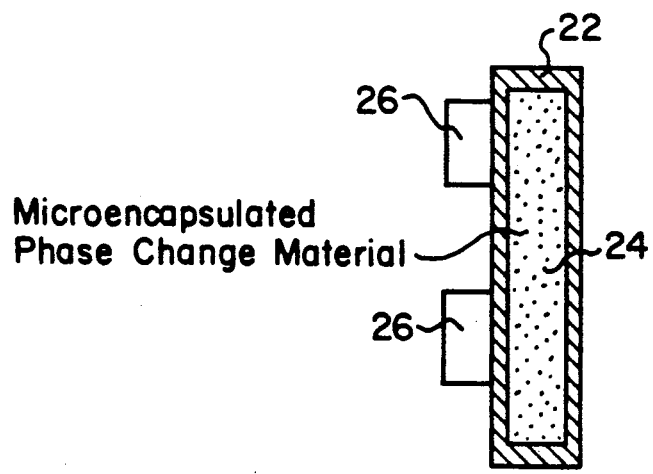
FIG. 2 is a schematic view of a passive temperature control unit provided in accordance with the present invention.
Figure 3:
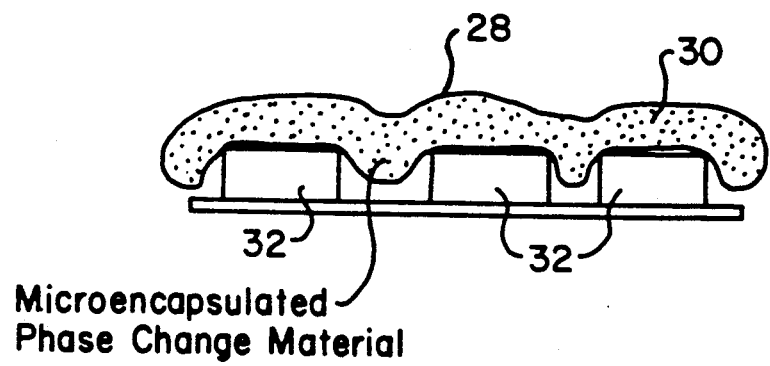
FIG. 3 is a schematic view of an alternate passive temperature control unit configuration provided in accordance with the present invention.
Figure 4:
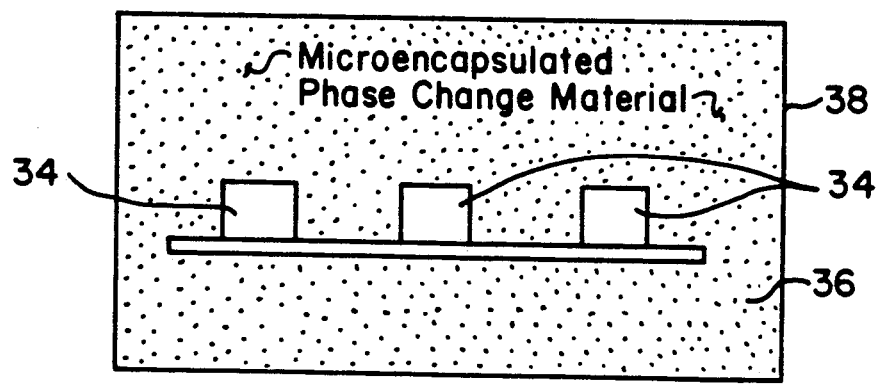
FIG. 4 is a schematic view of yet another passive temperature control unit provided in accordance with the present invention.

Examples of a container 22 having a slurry 24 of a liquid and microencapsulated phase change material defining a heat sink provided in accordance with the present invention for electronic component(s) 26 is shown in FIG. 2. The container may also be in the form of a flexible bag 28 with a slurry 30 therewithin so that it can conform to the shape of the electronic components 32, as shown in FIG. 3. On the other hand, devices 34 could be completely immersed in a slurry 36, provided in accordance with the present invention, disposed in an open container 38, as shown in FIG. 4.

The particle concentration will determine the maximum heat capacity of the unit. In addition, the concentration has a strong effect on the heat transfer coefficient. The higher the heat transfer coefficient, the lower the required temperature gradient for a given heat flux. The typical range will be between 0 and approximately 0.6. The particle size, like the particle concentration, has a strong effect on the heat transfer coefficient. An optimum value within the range of 50 micrometers-1000 micrometers must be selected so that sedimentation is minimized.

The temperature control unit of the invention must be as thin as structurally feasible. However, the heat transfer coefficient and the heat capacity increases with thickness. Therefore, the particular dimensions of the temperature control unit depend upon the intended use and expected heat capacity required.

Materials suitable for heat transfer applications include paraffins, organic acids, hydrated inorganic salts, low melting point metals and metallic eutectics, and a number of other organic materials which would be readily apparent to one of ordinary skill in this art. In accordance with the present invention, it is preferred that the core materials be one of noctadecane, n-eicosane, myristic acid, stearic acid and acetamide.

It is noteworthy that the core material of the microencapsulated material provided in accordance with the present invention may have a solid-solid phase transition. However, such materials are limited in number and therefore the solid-liquid phase change materials are preferred.

The encapsulating material can be any suitable material provided that the encapsulating material has a melting point higher than the melting point of the phase change material and higher than the expected temperature caused by the electronic component overheating. The encapsulating material should also be resilient so as to withstand expansion and contraction of the phase change material as it changes phase. examples of suitable encapsulating material are polyvinyl alcohols, polystyrene and metal, although other materials could be provided. The fluid in which the microencapsulated phase change material is suspended can be any suitable non-reactive cooling fluid such as water, cooling oil or fluorocarbons that is compatible with the material used to encapsulate the phase change material and the phase change material itself.

Finally, the material used to form the outer container of the heat sink of the invention can also be of any desired material as long as it is not flammable, is compatible with the liquid and microcapsules it encloses, has a higher melting point than the anticipated maximum temperature to which it will be exposed and exhibits a degree of resilience. The ordinary artisan would readily appreciate suitable polymers, metals or other materials that could be used therefor.

A variety of chemical and physical techniques for manufacturing different types of microcapsules exists and can be employed for forming microencapsulated phase change material in accordance with the present invention. For example, there are chemical methods for forming such microcapsules. Two of the most important methods are coacervation and interfacial polymerization. In microencapsulation using coacervation, the core particles are uniformly dispersed in an appropriate medium and the coacervate layer is deposited uniformly around the particles. The coating is then hardened by adding a reagent such as formaldehyde resulting in the cross-linking of the coacervate. In interfacial polymerization, the capsule wall is formed directly around the core material by polymerization reactions.

Physical methods of forming microcapsules include the air suspension process and the centrifugal extrusion process. In the air suspension process, the core particles are fluidized in an upwardly moving stream of air and are then spray coated. In the centrifugal extrusion process, the core material in its liquid phase flows through an inner tube and the coating material flows through an annular tube around it. As the head rotates, the core and coating material emerge from the orifices at the end of the tubes and break up into spherical drops due to surface tension forces. These are then solidified in a bath by using heat or suitable chemical reactions.

The structural and material stability of microcapsules provided in accordance with the present invention is of course vital. Therefore, the preferred manufacturing technique for microcapsules in accordance with the invention is based upon the process described in U.S. Pat. No. 3,726,803, entitled "Capsule Wall Treating Process Utilizing Condensation Polymerization and Capsule Product," the disclosure of which is incorporated herein by this reference.

As is apparent from the foregoing, the use of suspensions of phase change materials as a heat transfer fluid has a number of advantages.

First is an increase in the overall heat transfer by an order of magnitude over simple fluids which can be expected due to combined increases in effective thermal conductivity and specific heat. Second, a reduction in size of the cooling system for the same load can be expected because of the better heat transfer properties. Further, passive heat sinks can be designed for peak loads, resulting in greater reliability of the electronic component. Suspensions of phase change materials can be used as passive thermostats reducing sudden transients since the fluid temperature remains almost constant until the phase change material has changed phase. Finally, cooling systems for very high heat loads can be designed without major changes in the size of current cooling systems because of the superior heat transfer characteristics of the phase change suspensions provided in accordance with the present invention.

As is further apparent from the foregoing, the product of the invention can be used in the cooling of electronic components, for example computer, aircraft and spacecraft avionics. Indeed, the reliability of electronic devices is very sensitive to temperature level, temperature fluctuation in time and temperature variation base. All of these factors are positively addressed by the device of the present invention. Further, by using microencapsulated phase change materials of various types in a single device, the passive thermostat feature can be triggered at multiple temperatures. It is to be understood, furthermore, that the device of the present invention is not limited to the cooling of electronic components and indeed passive control of buildings, for example, would be possible using wall and roof panels filled with encapsulated phase change material slurries provided in accordance with the present invention.

While the invention has been described in connection with what is presently considered to be the most practical and preferred embodiment, it is to be understood that the invention is not to be limited to the disclosed embodiment, but, on the contrary, is intended to cover various modifications and equivalent arrangements included within the spirit and scope of the appended claims.

What is claimed is:

1. A heat sink device comprising:
   a sealed container; and
   a slurry of a microencapsulated phase change material and a fluid sealed within said container, said slurry being free flowing within said container.

2. A heat sink device as in claim 1, wherein said container is a flexible bag.

3. A heat sink device as in claim 1, wherein said container has walls of predetermined configuration so that said container has a predetermined shape.

4. A heat sink device as in claim 1, wherein said phase change material is a phase change material selected from n-octadecane, neicosane, myristic acid, stearic acid and acetamide.

5. A heat sink device as in claim 4, wherein said phase change material is encapsulated in a material that has a higher melting point than the encapsulated phase change material.

6. A heat sink device as in claim 5, wherein said phase change material is encapsulated in metal.

7. A heat sink device as in claim 5, wherein said phase change material is encapsulated in polystyrene or polyvinyl alcohol.

8. A heat sink device as in claim 1, wherein said phase change material is encapsulated in a material that has a higher melting point than the encapsulated phase change material.

9. A heat sink device as in claim 8, wherein said phase change material is encapsulated in metal.

10. A heat sink device as in claim 8, wherein said phase change material is encapsulated in polystyrene.

11. A heat sink device as in claim 1, wherein said liquid in which said microencapsulated phase change material is suspended is a non-reactive cooling fluid.

12. A method of maintaining the temperature of an electronic component comprising:
    providing a slurry of a liquid and microencapsulated phase change material;
    placing said slurry in an open container; and
    immersing the electronic component in said slurry within said container.

13. A method as in claim 12, wherein said step of providing a slurry comprises providing a slurry of non-reactive cooling fluid and microencapsulated phase change material.

14. A method as in claim 12, wherein said step of providing a slurry includes providing a microencapsulated phase change material selected from n-octadecane, n-eicosane, myristic acid, stearic acid and acetamide.

15. A method of maintaining the temperature of an electronic component comprising:
    providing a slurry of a liquid and microencapsulated phase change material;
    providing a container;
    disposing said slurry in said container;
    sealing said container; and
    placing said sealed container in contact with an electronic component.

16. A method as in claim 15, wherein said step of providing a slurry comprises providing a slurry of non-reactive cooling fluid and microencapsulated phase change material.

17. A method as in claim 15, wherein said step of providing a slurry includes providing a microencapsulated phase change material selected from n-octadecane, n-eicosane, myristic acid, stearic acid and acetamide.

18. A method as in claim 15, wherein said step of providing a container comprises providing a flexible bag.

19. A method as in claim 15, wherein said step of providing a container comprises providing a container having walls of predetermined configuration so that said container has a predetermined shape.

20. A method as in claim 15, wherein said step of providing a slurry includes providing a phase change material encapsulated in a material that has a higher melting point than the encapsulated phase change material.

* * * * *